United States Patent
Jang

(10) Patent No.: US 7,759,203 B2
(45) Date of Patent: Jul. 20, 2010

(54) MOS TRANSISTOR HAVING PROTRUDED-SHAPE CHANNEL AND METHOD OF FABRICATING THE SAME

(75) Inventor: Young-Chul Jang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/423,404

(22) Filed: Apr. 14, 2009

(65) Prior Publication Data

US 2009/0203180 A1    Aug. 13, 2009

Related U.S. Application Data

(62) Division of application No. 11/001,805, filed on Dec. 1, 2004, now Pat. No. 7,538,386.

(30) Foreign Application Priority Data

Dec. 3, 2003    (KR)    ............... 2003-87249

(51) Int. Cl.
*H01L 21/336*    (2006.01)
(52) U.S. Cl. ............... 438/294; 257/E29.135
(58) Field of Classification Search ........... 438/294; 257/E29.135
See application file for complete search history.

(56) References Cited

U.S. PATENT DOCUMENTS 6,479,851 B1    11/2002    Lee
6,525,368 B1    2/2003    Fastow
6,642,090 B1    11/2003    Fried et al.
6,885,055 B2    4/2005    Lee
7,087,499 B2    8/2006    Rankin et al.
2003/0042531 A1    3/2003    Lee et al.

FOREIGN PATENT DOCUMENTS

JP    6-302819    10/1994

OTHER PUBLICATIONS

English language abstract of Japanese Patent No. 6-302819.

*Primary Examiner*—Bradley K Smith
*Assistant Examiner*—Amar Movva
(74) *Attorney, Agent, or Firm*—Stanzione & Kim, LLP

(57) ABSTRACT

A MOS transistor that has a protruding portion with a favorable vertical profile and a protruded-shape channel that requires no additional photolithography process, and a method of fabricating the same are provided. A first mask that defines an isolation region of a substrate is overall etched to form a second mask with a smaller width than the first mask. Then, the substrate is etched to a predetermined depth while using the second mask as an etch mask, thereby forming the protruding portion. Without performing a photolithography process, the protruding portion has a favorable profile and the protruding height of an isolation layer is adjusted to be capable of appropriately performing ion implantation upon the protruding portion.

12 Claims, 5 Drawing Sheets

MOS TRANSISTOR HAVING PROTRUDED-SHAPE CHANNEL AND METHOD OF FABRICATING THE SAME

CROSS REFERENCE TO RELATED APPLICATION

This application is a Divisional of U.S. patent application Ser. No. 11/001,805, filed on Dec. 1, 2004, now pending, which claims priority under 35 U.S.C. §119 from Korean Patent Application No. 2003-87249, filed on Dec. 3, 2003, in the Korean Intellectual Property Office, the entire contents of which are hereby incorporated by reference

BACKGROUND OF THE INVENTION

1. Field of the Invention

The present invention relates to a semiconductor device and a method of fabricating the same, and more particularly to a Metal-Oxide-Semiconductor (MOS) transistor and a method of fabricating the same.

2. Description of the Related Art

One technique that can be used to achieve high packing density in semiconductor devices is to shorten the length of gate channels in transistors. Shortening the channel length produces several problems such as short channel effect, minute pattern formation and restriction in operating speed. Of these problems, the short channel effect is the often the most serious problem. For example, it can increase the electrical field near the drain region and generate punchthrough, thereby causing a drain depletion region to penetrate into a potential barrier around a source region. Also, thermoelectron emission can incite avalanche breakdown and the resultant electrical field in a vertical direction decreases the mobility of carriers.

To solve the foregoing problems, a MOS transistor in which a channel protrudes in the vertical direction has been developed. A transistor having the protruded-shape channel is often referred to as a Fin Field Effect Transistor (FinFET). A FinFET can be manufactured by performing photolithography upon a Silicon-on-Insulator (SOI) substrate to form a fin which is the protruding portion. This done by photolithography upon a silicon substrate to form the fin, or by performing various other similar processes.

However, SOI may cause a floating body effect due to a lack of connection between a channel and the substrate, and it may degrade performance of the device due to lack of thermal conductivity. Furthermore, use of the SOI is much more expensive than the use of a silicon substrate. When the fin is fabricated by the photolithography, the narrow line width makes the patterning fastidious. Moreover, in such a process, the photolithography process is separately performed, and this results in further expenses.

The fin can also be fabricated using a wet etching method. However, when the fin is fabricated by wet etching, the vertical profile of the fin sometimes becomes inconsistent. That is, notching occurs in the fin or footing resulting from the widening of a lower end of the fin in contact with the substrate. In addition, undercutting occurs at both ends of the fin may occur.

SUMMARY OF THE INVENTION

The present invention provides a method of fabricating a semiconductor device comprising a protruding portion with a desirable vertical profile and a protruded-shape channel without performing an additional photolithography process.

According to an aspect of the present invention, a semiconductor device is fabricated by a method that includes forming an isolation layer by etching a substrate, using a first mask that defines an isolation region of the substrate. Then, a second mask is formed by etching the first mask. The second mask has a smaller width than the first mask by a predetermined amount. Then, the isolation region is filled with a filling layer, and an upper portion of the filling layer is removed so as to expose an upper surface of the substrate. A protruding portion is then formed by etching the substrate to a predetermined depth, using the second mask and the filling layer as etch masks. Thereafter, a channel region is formed upon at least one side surface of the protruding portion by ion implantation. Then, after the second mask is removed, a gate insulating layer and a gate electrode are formed to cover the upper surface and the at least one side surface of the protruding portion.

In the forming of the second mask, the etching may be an etch-back process. Also, the width of the second mask can determine the width of the protruding portion. In the forming of the second mask, the etch process can be carried out to allow an etch selectivity of the substrate with respect to the first mask to be about 1:50 or greater.

In the forming of the protruding portion, it is preferable that the substrate is etched via anisotropic dry etching. In addition, the filling layer within the substrate may be etched a predetermined amount while the substrate is etched.

The height of the protruding portion may be determined by the depth of the substrate after the substrate is etched, and the protruding portion has a hexahedral shape or at least one surface of the protruding portion is subjected to rounding. Further, the upper surface of the protruding portion is subjected to the rounding operation.

Preferably, the protruding height of the isolation layer is adjusted so as to allow for ion implantation upon at least one side surface of the protruding portion.

The channel region is formed in the upper surface and at least one side surface of the protruding portion after the second mask is removed.

According to another aspect of the present invention, a MOS transistor includes an isolation layer that defines an active region of a substrate and extends over the substrate. Moreover, a protruding portion extending in a vertical direction and has a source region and a drain region on the active region. A channel region is formed in at least one surface of the protruding portion via an ion implantation, and a gate electrode covers the upper surface and both side surfaces of the protruding portion by disposing a gate insulating layer over the channel region.

The protruded height of the isolation layer can be adjusted so as to perform ion implantation upon the at least one side surface of the protruding portion. Additionally, a vertical profile of the protruding portion is favorable.

The channel region can be formed in the upper surface and the at least one side surface of the protruding portion.

BRIEF DESCRIPTION OF THE DRAWINGS

The above and other features and advantages of the present invention will become more apparent by the following description which provides details of exemplary embodiments thereof with reference to the attached drawings in which:

FIGS. 2 through 9 are sectional views illustrating a method of fabricating a MOS transistor according to a first embodiment of the present invention, of which FIG. 4b is a plan view of a step illustrated in FIG. 4a.

DETAILED DESCRIPTION OF THE PREFERRED EMBODIMENTS

Figure 1:
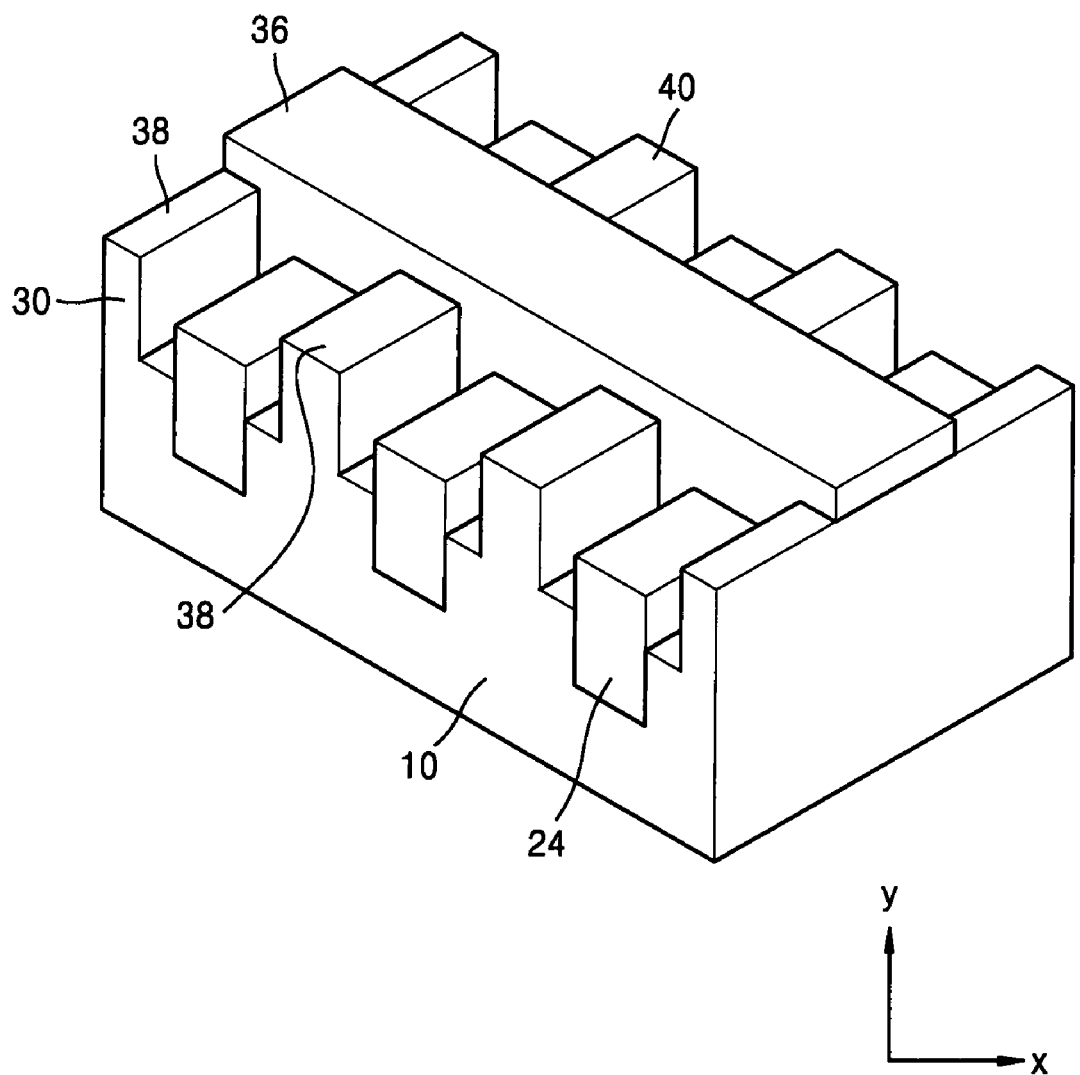
FIG. 1 is a perspective view of a MOS transistor according to an exemplary embodiment of the present invention.

FIG. 1 is a perspective view of a MOS transistor according to a first exemplary embodiment of the present invention.

Referring to FIG. 1, an active region is defined in an integrated circuit (IC) substrate 10, e.g., a silicon substrate. An isolation layer 24 extends over the substrate 10. A protruding portion 30 formed on the active region extends in a vertical direction and includes a source region 38 and a drain region 40. A gate electrode 36 covers an upper surface and both sides of the protruding portion 30 while interposing a gate insulating layer (refer to reference numeral 34 in FIG. 9). A channel region (refer to reference numeral 32a in FIG. 8) is formed under the gate insulating layer 34.

A source voltage is applied to the source region 38 and a drain voltage is applied to the drain region 40. A current flows through a channel region between the source region 38 and the drain region 40, and is controlled by the voltage applied to the gate electrode 36. FIGS. 2 through 9 are cross-sectional views illustrating a method of fabricating the MOS transistor according to a first embodiment of the present invention. FIG. 4b is a plan view of a step illustrated in FIG. 4a.

Figure 2:
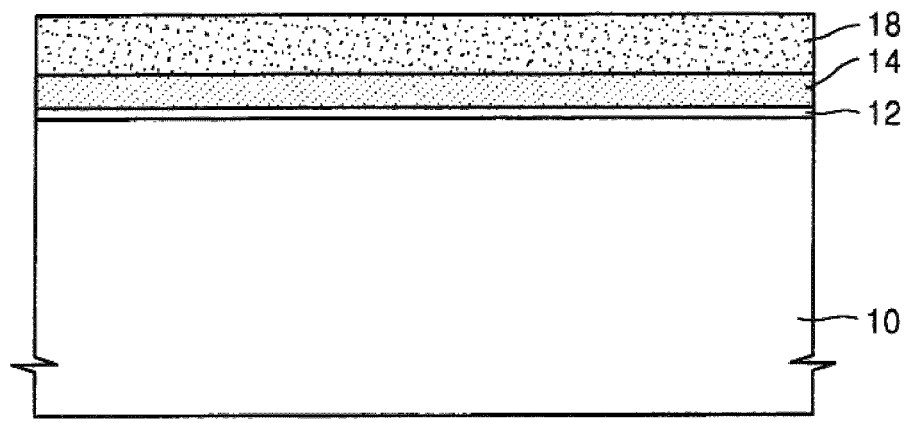

Referring to FIG. 2, a pad oxide layer 12 and a hard mask layer 14 formed of a material such as nitride are sequentially formed on the IC substrate 10. An organic Anti Reflection Coating (ARC) (not shown) and a photoresist 18 are coated on the hard mask layer 14. The pad oxide layer 12 reduces stress between the substrate 10 and the hard mask layer 14, which is formed to a thickness of about 20 to about 200 Å, and is preferably about 100 Å. The hard mask layer 14 is used as a hard mask during etching for forming an isolation region. To form the hard mask layer 14, a nitride material such as silicon nitride is deposited to a thickness of about 500 to about 2,000 Å, and preferably about 800 to about 850 Å.

Figure 3:
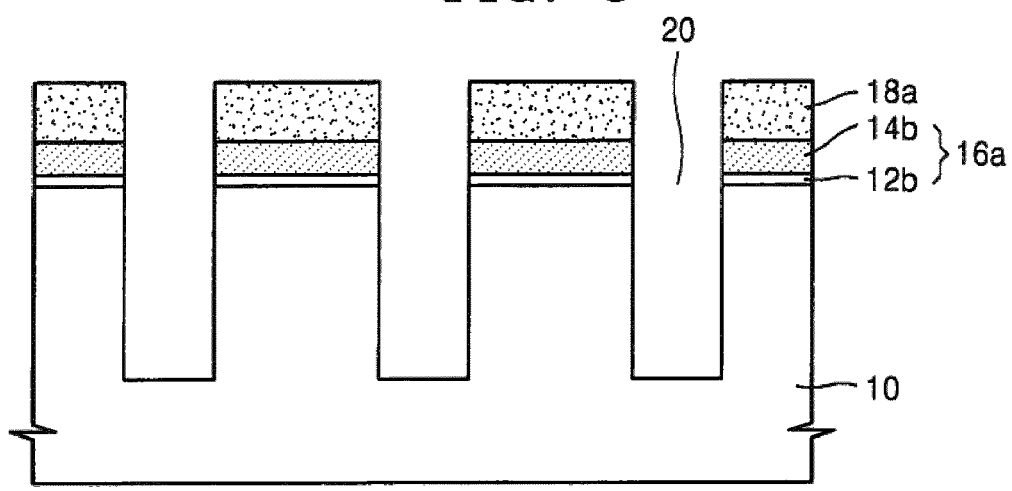

Referring to FIG. 3, a photoresist pattern 18a that defines the isolation region is formed. Thereafter, the hard mask layer 14 and the pad oxide layer 12 are etched using a dry etching method using the photoresist pattern 18a as a mask so that a first mask 16a is formed by a nitride layer pattern 14a and a pad oxide layer pattern 12a. When etching the hard mask layer 14, a gas selected from one of the fluorocarbon group or the phosphoric acid group may be utilized.

After the photoresist pattern 18a is removed, an exposed portion of the substrate 10 is subjected to anisotropic dry etching, using the first mask 16a, as an etching mask to form a region 20 in which the isolation layer that defines the active region will be formed. The photoresist pattern 18a may be removed by a conventional method such as ashing using an oxygen plasma and then organic stripping.

A silicon oxide layer (not shown) is formed on the resultant structure including the isolation region 20. The silicon oxide layer is formed on the inner sidewall and bottom of isolation region 20 to cure the damage caused during the etching process that forms the isolation region 20. Additionally, a nitride layer (not shown) may be formed on the resultant structure with the silicon oxide layer. The nitride layer is aligned along the sidewall of the isolation region 20 and therefore has a linear surface. The nitride layer inhibits oxidation of the oxide layer in succeeding processes and reinforces the insulating characteristics of the isolation region 20. The nitride layer may be formed to a thickness of 50 to 300 Å.

Figure 4A:
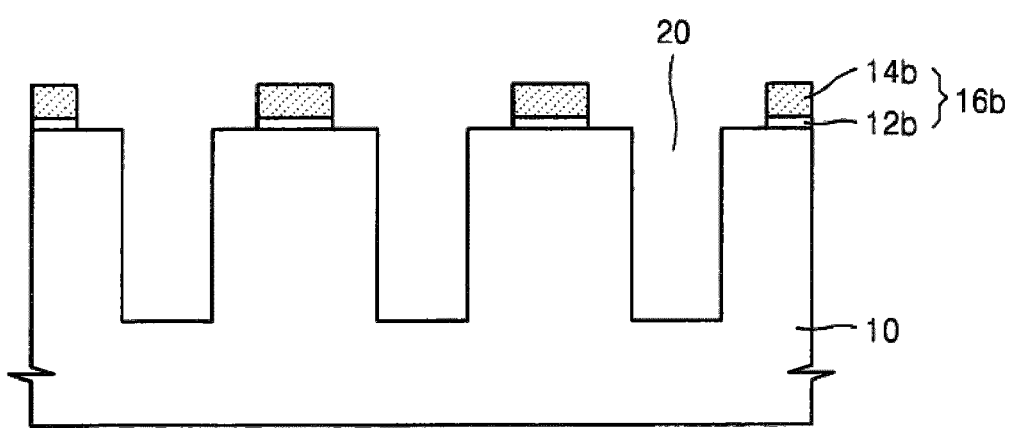
Figure 4B:
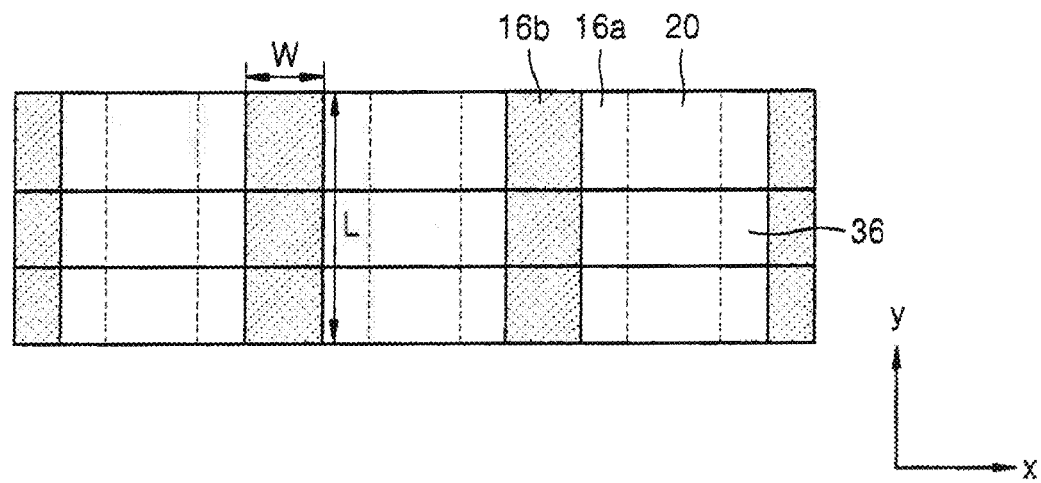

Referring to FIG. 4a, a second mask 16b is formed by performing an etching process, e.g., etch-back, upon substrate 10 including the first mask 16a. The etch selectivity of the substrate 10 with respect to the first mask 16a is about 1:50 or greater. Because of the etch-back carried out on the entire surface, the second mask 16b is decreased in the consistent interval along both a width W (x direction) and a length L (y direction) of the first mask 16a.

FIG. 4b shows the second mask 16b obtained by etching the first mask 16a at the uniform interval. The first mask 16a is denoted by a dotted line, and the second mask 16b is denoted by a solid line. The first mask 16a is uniformly shrunken in the direction x. The shrunken shape in the y-direction is not shown for convenience of description. Reference numeral 36 denotes a gate electrode, which will be described with reference to FIG. 9. The width W and length L of second mask 16b define a width and length of a protruding portion (30 of FIG. 1).

Figure 5:
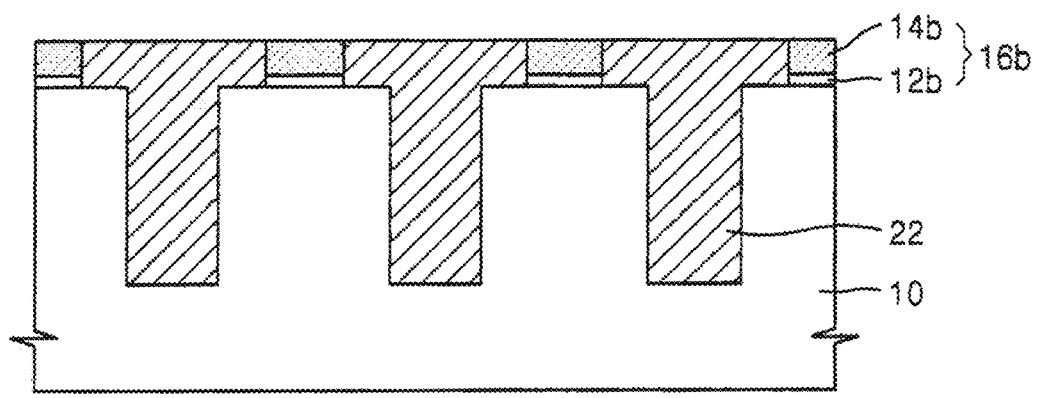

Referring to FIG. 5, the isolation region 20 and the space between the second mask 16b are filled with a filling layer 22. The filling layer 22 may be an Undoped Silicon Glass (USG) layer, a High Density Plasma (HDP) oxide layer, a tetraethylorthosilicate (TEOS) layer formed by using Plasma Enhanced Chemical Vapor Deposition (PECVD), an oxide layer formed by using the PECVD, or an insulating layer consisting of a combination of the foregoing layers. Among these, the HDP oxide layer, which has compact film quality, is most suitable for filling the isolation region 20. The HDP CVD process combines a method of etching by sputtering, in which not only a deposition gas for depositing a material layer is supplied to a process chamber but also a sputtering gas capable of etching the material layer deposited via the sputtering method is supplied to the chamber. $SiH_4$ and $O_2$ are used as the deposition gas, and an inactive gas (e.g., Ar gas) is used as the sputtering gas. The deposition gas and sputtering gas supplied are partially ionized by the plasma, incited within the chamber by a high frequency electric power. A wafer chuck (i.e., an electrostatic chuck) is loaded with the substrate within the chamber and biased high frequency electric power is applied thereto. Thus, the ionized deposition gas and sputtering gas are accelerated to the surface of the substrate. Accelerated deposition gas ions form the silicon oxide layer, and accelerated sputtering gas ions sputter the deposited silicon oxide layer. Thus, the film quality becomes compact and the gap fill characteristic is favorable when the filling layer 22 is the HDP oxide layer.

The filling layer 22 is planarized until a top surface of the second mask 16b is exposed. The planarization may be carried out by Chemical Mechanical Polishing (CMP) or etch-back. During the planarization, the second mask 16b is used as the planarization stop layer. The interval between the second masks 16b is increased to facilitate the filling of the isolation region 20. However, in the conventional method, the isolation region 20 is filled without widening the gap between the first mask 16a.

Figure 6:
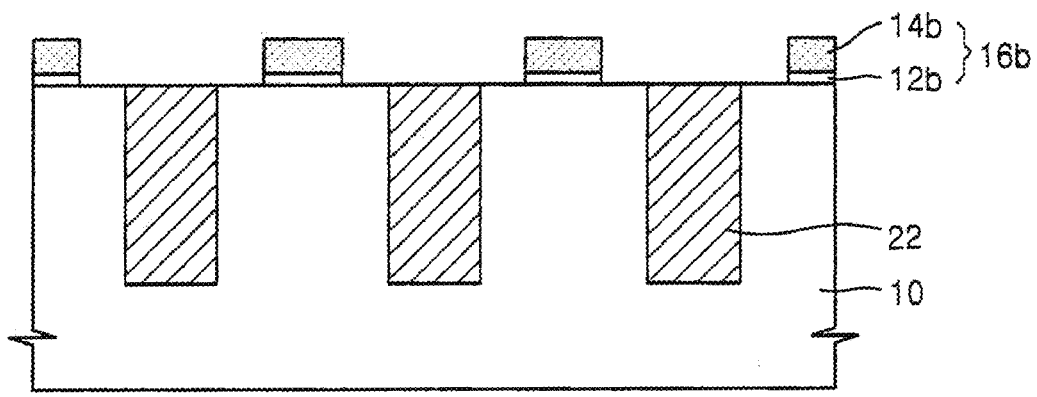

Referring to FIG. 6, an upper portion of the filling layer 22 is removed such that the upper surface of the substrate 10 is flush with (forming a common surface) with an upper surface of the filling layer 22. That is, the upper portion of filling layer 22 is removed so as to expose the upper surface of substrate 10. Here, the filling layer 22 may be removed by the etch-back process.

Figure 7:
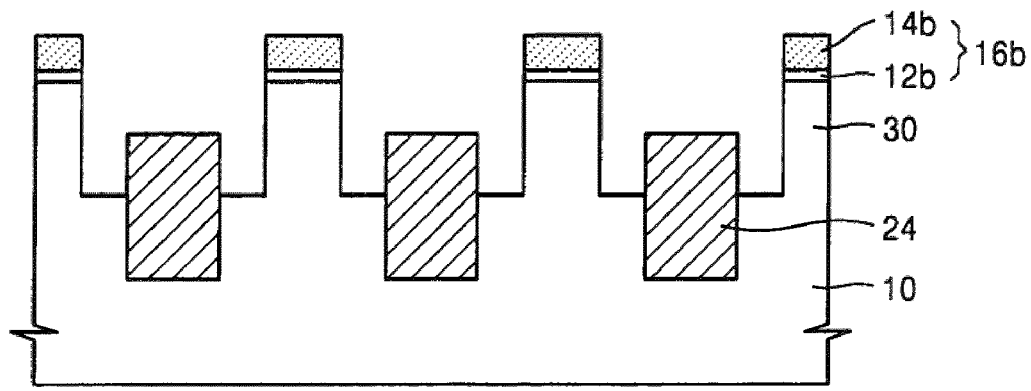

With reference to FIG. 7, the substrate 10 is etched to a predetermined depth to form a protruding portion 30, using the second mask 16b and the filling layer 22 as an etch mask.

The substrate 10 may be removed by an anisotropic dry etching method, for example, using a plasma. While carrying out the plasma etching method, electrically charged particles (ions and electrons) released as a result of interaction with a chemical reaction gas, generate a reactive gas mixture within a reactor with the assistance of electric discharge. The positive ions in the reactive gas mixture are accelerated to the substrate 10 by means of the electric bias induced by applying a Radio Frequency (RF) field upon the substrate 10. Consequently, the positive ions travel perpendicularly toward the surface of the substrate 10, thereby promoting the chemical reaction between the substrate 10 and reactive gas mixture.

Since the substrate 10 is etched by the anisotropic dry etching method, the profile of the protruding portion 30 can be satisfactory, i.e., vertical. However, it the substrate 10 is wet etched as in conventional methods, the profile of protruding portion 30 may not be desirable. That is, an undercut can be formed at the edge of protruding portion 30, and notching at the sidewall and a footing phenomenon can occur at the lower end of protruding portion 30.

The height of the protruding portion 30 is determined by the depth of the etching substrate 10 and determines the width of the channel region. The substrate 10 may be etched to a depth of about 700 to 2,000 Å, and preferably about 950 to 1,050 Å. The protruding portion 30 may have a hexahedral shape. Alternatively, at least one side thereof is rounded to prevent an electric field from concentrating on an edge of the protruding portion 30.

After the substrate 10 is etched, the filling layer 22 is etched a predetermined amount to form the isolation layer 24. The etch selectivity of the substrate 10 with respect to the isolation layer 24 is adjusted to determine the extent to which the isolation layer 24 is etched. The decrease in the height of the isolation layer 24 facilitates deposition of the gate electrode 36 in a subsequent process. The extent of etching the isolation layer 24 will be descried later in connection with ion implantation.

Figure 8:
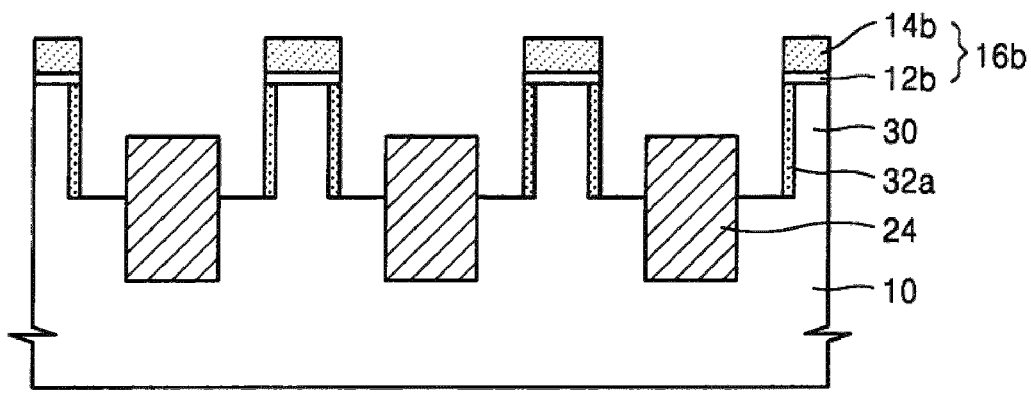

Referring to FIG. 8, a channel region 32a is formed in at least one side surface of the protruding portion 30 by ion implantation. The protruding height of the isolation layer 24 is determined by the etch selectivity mentioned with reference to FIG. 7 so that the ion implantation can be performed into at least one side surface of the protruding portion 30. It is noted that the etch selectivity depends on an angle at which ions are incident on the protruding portion 30. For instance, as the angle of incidence of the ion increases, the protruding height of the isolation layer 24 can be greater. In this case, the etch selectivity may be set to be large, thus decreasing the extent to which the isolation layer 24 is etched. By doing so, the protruding height of the isolation layer 24 is increased. On the other hand, as the angle of incidence of the ions is decreased, the protruding height of the isolation layer 24 is also decreased. In this case, the etch selectivity is set to be small so that the isolation layer 24 is etched to a large extent.

Figure 9:
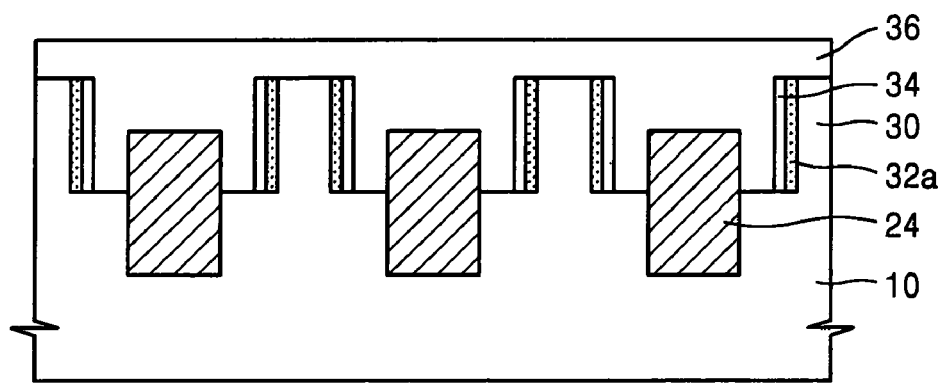

Referring to FIG. 9, the second mask 16b is removed and the gate insulating layer 34 and the gate electrode 36 are sequentially formed on the resultant structure using a photolithography process. In other words, the gate insulating layer 34 and the gate electrode 36 cover the upper surface and side surface of the channel region 32a. The gate electrode 36 may be formed of a polysilicon or a metal such as, Al, W, $WN_x$, Ta, TaN, Ru, Ti, TiN, Pt or a combination thereof.

Depending on the circumstances, the gate insulating layer 34 may be formed prior to forming the channel region 32a. The source region (38 of FIG. 1) and the drain region (40 of FIG. 1) are then formed via ion implantation, thereby completing the MOS transistor.

Figure 10:
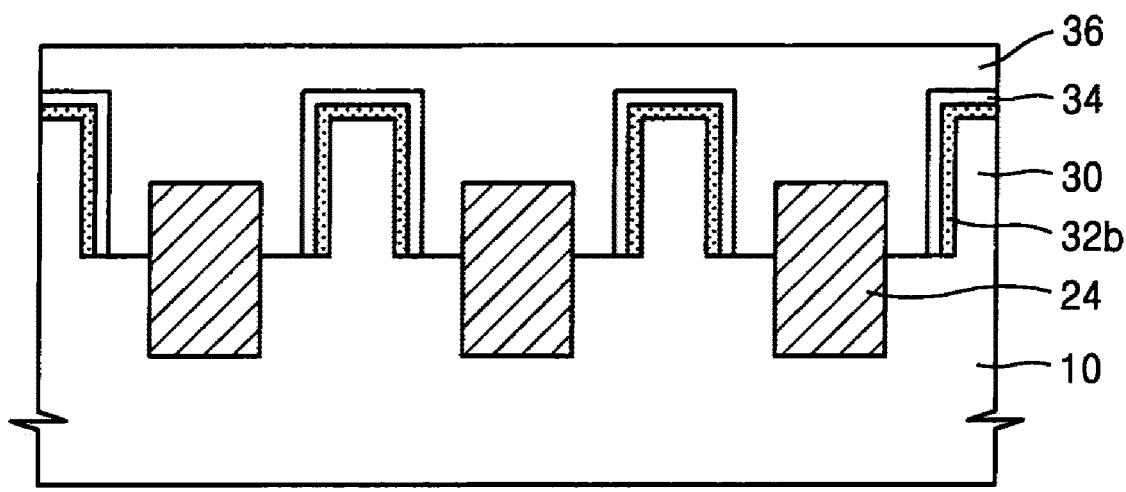
FIG. 10 is a sectional view for illustrating a method of fabricating a MOS transistor according to a second exemplary embodiment of the present invention.

FIG. 10 is a cross-sectional view illustrating a method of fabricating a MOS transistor according to a second embodiment of the present invention. The elements equivalent to those mentioned in accordance with the first exemplary embodiment are designated by the same reference numerals, and a detailed description thereof will be omitted.

Referring to FIG. 10, the protruding portion 30 is formed as described with reference to FIGS. 2 to 7. Then, the second mask 16b is removed by the method identical to that of the first embodiment, and the isolation layer 24 is etched a predetermined amount. Thereafter, ion implantation is performed upon the upper surface and at least one side surface of the protruding portion 30 to form a channel region 32b. The protruding height of isolation layer 24 is determined by the etch selectivity so as to allow for the ion implantation upon the at least one side surface of the protruding portion 30. In other words, the etch selectivity depends on the angle of incidence of the ions protruding portion 30. As the angle of incidence of the ions increases, the protruding height of isolation layer 24 may be greater. The protruding height of the isolation layer 24 is determined by the etch selectivity of the second mask 16b, the isolation layer 24 and the substrate 10.

The gate insulating layer 34 and the gate electrode 36 are sequentially formed on the channel region 32b using a photolithography process. That is, the gate insulating layer 34 and the gate electrode 36 cover the upper surface and side surface of the channel region 32b. If necessary, the channel region 32b may be formed after forming the gate insulating layer 34. The source region (38 of FIG. 1) and the drain region (40 of FIG. 1) are then formed using ion implantation to complete the MOS transistor.

In the MOS transistor having the protruded-shape channel and method of fabricating the same according to exemplary embodiments of the present invention, the protruding portion that includes the source and drain regions can be formed without performing a separate photolithography process. Moreover, the protruding portion is formed using a dry etching method, resulting in a favorable profile, and the width of the channel region can be determined in accordance with the extent to which the protruding portion is etched. Further, the protruding height of the isolation layer is adjusted such that suitable ion implantation upon the protruding portion.

It is noted that in the forming of the second mask, the etching may be an etch-back process. Also, the width of the second mask can determine the width of the protruding portion. In the forming of the second mask, the etch process can be carried out to allow an etch selectivity of the substrate with respect to the first mask to be about 1:50 or greater.

It is also noted that in the forming of the protruding portion, it is preferable that the substrate is etched via anisotropic dry etching. In addition, the filling layer within the substrate may be etched a predetermined amount while the substrate is etched.

The height of the protruding portion may be determined by the depth of the substrate after the substrate is etched, and the protruding portion has a hexahedral shape or at least one surface of the protruding portion is subjected to rounding. Further, the upper surface of the protruding portion is subjected to the rounding operation. Preferably, the protruding height of the isolation layer is adjusted so as to allow for ion implantation upon at least one side surface of the protruding portion.

It is also noted that the channel region is formed in the upper surface and at least one side surface of the protruding portion after the second mask is removed.

The protruded height of the isolation layer can be adjusted so as to perform ion implantation upon the at least one side surface of the protruding portion. Additionally, a vertical profile of the protruding portion is favorable. The channel region can be formed in the upper surface and the at least one side surface of the protruding portion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device comprising:
    forming an isolation region in which an isolation layer will be formed by etching a portion of a substrate, using a first mask that defines the isolation region of said substrate;
    reducing a width of said first mask by a predetermined amount, using an etch process, to form a second mask from said first mask;
    filling said isolation region with a filling layer, and removing an upper portion of said filling layer so as to expose an upper surface of said substrate;
    etching said substrate to a predetermined depth, using said second mask and said filling layer as etch masks, to form a protruding portion;
    performing an ion implantation process upon at least one side surface of said protruding portion, thereby forming a channel region; and
    removing said second mask, and forming a gate insulating layer and a gate electrode that covers the upper surface and the at least one side surface of said protruding portion.

2. The method as claimed in claim 1, wherein said second mask is formed by performing an etch-back process upon said first mask.

3. The method as claimed in claim 1, wherein a width of said second mask determines a width of said protruding portion.

4. The method as claimed in claim 1, wherein, in said forming of said second mask, said etching is carried out with an etch selectivity of said substrate with respect to said first mask to be about 1:50 or greater.

5. The method as claimed in claim 1, wherein said filling layer comprises a High Density Plasma (HDP) oxide layer.

6. The method as claimed in claim 1, wherein, in said forming of said protruding portion, said substrate is etched using anisotropic dry etching.

7. The method as claimed in claim 1, wherein said filling layer within said substrate is etched to a predetermined amount while said substrate is etched.

8. The method as claimed in claim 1, wherein the height of said protruding portion is determined by the depth of said substrate after said substrate is etched.

9. The method as claimed in claim 1, wherein said protruding portion has a hexahedral shape or has at least one surface subjected to rounding.

10. The method as claimed in claim 1, wherein an upper surface of said protruding portion is subjected to rounding.

11. The method of as claimed in claim 1, wherein the protruding height of said isolation layer is adjusted so as to perform ion implantation upon the at least one side surface of said protruding portion.

12. The method as claimed in claim 1, wherein said second mask is removed before said channel region is formed, and said channel region is formed on an upper surface and the at least one side surface of said protruding portion.

* * * * *